US007418369B2

(12) United States Patent
Moskewicz et al.

(10) Patent No.: US 7,418,369 B2
(45) Date of Patent: Aug. 26, 2008

(54) METHOD AND SYSTEM FOR EFFICIENT IMPLEMENTATION OF BOOLEAN SATISFIABILITY

(75) Inventors: Matthew Moskewicz, Berkeley, CA (US); Conor Madigan, Boston, MA (US); Sharad Malik, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 511 days.

(21) Appl. No.: 10/238,125

(22) Filed: Sep. 9, 2002

(65) Prior Publication Data

US 2003/0084411 A1    May 1, 2003

Related U.S. Application Data

(60) Provisional application No. 60/318,110, filed on Sep. 7, 2001.

(51) Int. Cl.
*G06F 17/11* (2006.01)
(52) U.S. Cl. .............................. 703/2; 703/14
(58) Field of Classification Search .................. 703/14, 703/2; 716/4
See application file for complete search history.

(56) References Cited

U.S. PATENT DOCUMENTS

| | | | | |
|---|---|---|---|---|
| 6,038,392 A | 3/2000 | Ashar | ............................ | 703/27 |
| 6,247,164 B1 | 6/2001 | Ashar | ............................ | 716/5 |
| 6,651,234 B2 | 11/2003 | Gupta | ............................ | 716/7 |

OTHER PUBLICATIONS

Matthew W. Moskewicz, Conor F. Madigan, Ying Zhao, Lintao Zhang, Sharad Malik; "Chaff: Engineering an Efficient SAT Solver"; Jun. 18-22, 2001; DAC 2001; pp. 530-535.*
Udi Manber, "Introduction to Algorithms, A Creative Approach", 1989, Addison-Wesley Publishing Company, Inc., pp. 344-347, 356-363.*
Peixin Zhong, Pranav Ashar, Sharad Malik, Margaret Martonosi; "Using Reconfigurable Computing Techniques to Accelerate Problems in the CAD Domain: A Case Study with Boolean Satisfiability"; Jun. 15-19, 1998; DAC 1998; pp. 194-199.*

(Continued)

*Primary Examiner*—Paul Rodriguez
*Assistant Examiner*—Jason Proctor
(74) *Attorney, Agent, or Firm*—Niels Haun; Dann, Dorfman, Herrell and Skillman (57) ABSTRACT

Disclosed is a complete SAT solver, Chaff, which is one to two orders of magnitude faster than existing SAT solvers. Using the Davis-Putnam (DP) backtrack search strategy, Chaff employs efficient Boolean Constraint Propagation (BCP), termed two literal watching, and a low overhead decision making strategy, termed Variable State Independent Decaying Sum (VSIDS). During BCP, Chaff watches two literals not assigned to zero. The literals can be specifically ordered or randomly selected. VSIDS ranks variables, the highest-ranking literal having the highest counter value, where counter value is incremented by one for each occurrence of a literal in a clause. Periodically, the counters are divided by a constant to favor literals included in recently created conflict clauses. VSIDS can also be used to select watched literals, the literal least likely to be set (i.e., lowest VSIDS rank, or lowest VSIDS rank combined with last decision level) being selected to watch.

31 Claims, 4 Drawing Sheets

OTHER PUBLICATIONS

Joäo P. Marques-Silva and Karem A. Sakallah, "Boolean Satisfiability in Electronic Design Automation", 2000, ACM, p. 675-680.*

Mark Overmars, "Programming Lego Robots using NQC", Oct. 2, 1999, Utrecht University, pp. 1-43.*

Marques-Silva, J. P., and Sakallah, K. A., "GRASP: A Search Algorithm for Propositional Satisfiability," IEEE Transactions on Computers, 1063-6757/96, 220-227, 1996, 7 pages.

Zhang, H., "SATO: An Efficient Propositional Prover," Proceedings of the International Conference on Automated Deduction, pp. 272-275, Jul. 1997, 4 pages.

M. Davis and H. Putnam, A Computing Procedure for Quantification Theory, Journal of the ACM, 7:201-215, 1960, 15 pages.

M. Davis, G. Logemann and D. Loveland, "A Machine Program for Theorem-Proving", Communications of the ACM, vol. 5, No. 7, pp. 394-397, 1962, 4 pages.

Marques-Silva, J. P., The Impact of Branching Heuristics in Propositional Satisfiability Algorithms, Proceedings of the 9th Portuguese Conference on Artificial Intelligence (EPIA), Sep. 1999, 13 pages.

R. Bayardo, and R. Schrag, "Using CSP Look-Back Techniques to Solve Real-World SAT Instances", Proceedings of the 14th Nat. (US) Conf. on Artificial Intelligence (AAAI-97), AAAI Press/The MIT Press, 203-208, 1997, 6 pages.

L. Zhang, C. Madigan, M. Moskewicz and S. Malik, "Efficient Conflict Driven Learning in a Boolean Satisfiability Solver," Proceedings of the International Conference on Computer-Aided Design (ICCAD), 2001, 7 pages.

L. Baptista, I. Lynce and J. Marques-Silva, "Complete Search Restart Strategies for Satisfiability," IJCAI '01 Workshop on Stochastic Search Algorithms (IJCAI-SSA), Aug. 2001, 5 pages.

* cited by examiner

METHOD AND SYSTEM FOR EFFICIENT IMPLEMENTATION OF BOOLEAN SATISFIABILITY

RELATED APPLICATIONS

This application claims benefit of U.S. Provisional Application Ser. No. 60/318,110, filed Sep. 7, 2001, entitled "Method for Efficient Implementation of Boolean Satisfiability."

FIELD OF THE INVENTION

The present invention relates generally to solving the problem of Boolean Satisfiability, and more particularly to a method and system employing an efficient implementation of Boolean Constraint Propagation (BCP) and a low overhead decision strategy.

BACKGROUND OF THE INVENTION

Boolean Satisfiability (SAT) is probably the most studied of combinatorial optimization/search problems. A combinatorial search problem involves finding a condition with specified properties from a large space of all possible conditions arising from the various combinations of the variables in the system. Accordingly, SAT seeks to find a satisfying logical assignment for a propositional logic formula.

Significant effort has been devoted to providing practical solutions to SAT problems for applications in Electronic Design Automation (EDA) and Artificial Intelligence (AI), particularly to prove the correctness of a given digital logic circuit. As a result, the subject of practical SAT solvers has received considerable research attention, and numerous solver algorithms have been proposed and implemented.

Among existing SAT solvers are GRASP, POSIT, SATO, rel_sat and WalkSAT. GRASP and SATO find significant use in both research and industry. To learn about GRASP and SATO, see the following, each of which is incorporated by reference for its useful background information:

Marques-Silva, J. P., and Sakallah, K. A., "GRASP: A Search Algorithm for Propositional Satisfiability," *IEEE Transactions on Computers*, vol. 48, 506-521, 1999.

Zhang, H., "SATO: An Efficient Propositional Prover," *Proceedings of the International Conference on Automated Deduction*, pages 272-275, July 1997.

Most SAT solvers employ some combination of two main strategies: the Davis-Putnam (DP) backtrack search and heuristic local search. Heuristic local search techniques are not guaranteed to be complete (i.e. they are not guaranteed to find a satisfying assignment if one exists or to prove unsatisfiability if a satisfying assignment does not exist). As a result, complete SAT solvers are based almost exclusively on the DP search algorithm.

Methods employed by SAT solvers using the DP search algorithm can generally be summarized in three steps: making decisions, searching for implications and resolving conflicts. Making decisions involves assigning variables to either zero or one. Searching for implications involves analyzing variable assignments (i.e., decisions made) to find further assignments that, if made, move the SAT problem closer to solution. Typically, searching for implications is performed by a technique known as Boolean Constraint Propagation (BCP). Resolving conflicts undoes variable assignments that have generated implications setting the same variable to both zero and one in different portions of the logic formula (i.e., a conflict is reached when a decision (variable assignment) generates implications setting the same variable to both zero and one in different portions of the logic formula).

In practice, difficult SAT problems can require SAT solvers to run many weeks or more to find a satisfying solution. This type of run time requirement is simply not practical when numerous problems must be solved, or when problem solutions must be expedited. For this reason, there is a need for a faster SAT solver.

In addition, for most SAT problems, a major portion (greater than 90% in some cases) of SAT solver run time is spent in the BCP process. For this reason, there is a need for a more efficient BCP engine, the BCP engine being key to any successful SAT solver and significantly responsible for overall solver run time.

Further, existing strategies for making decisions are mostly directed to minimizing the number of decisions made. However, minimizing the number of decisions made does not necessarily mean minimizing overall solver run time for a given SAT problem, as one particular sequence of decisions, even if minimal in number, could lead to more BCP operations, therefore resulting in greater overall solver run time. Also, when considering different decision-making strategies, computational overhead must be considered. The time required to develop a certain sequence of assignments could negate the benefit gained from implementing the sequencing strategy. Therefore, there is also a need for a low overhead decision making strategy, one highly optimized for speed and specifically designed to operate with an efficient BCP scheme.

SUMMARY OF THE INVENTION

The present invention is a complete SAT solver, known as Chaff, that is at least an order of magnitude (and in several cases, two orders of magnitude) faster than existing SAT solvers, including GRASP and SATO, on difficult SAT problems from the EDA domain.

The method and system of the present invention employs an efficient implementation of Boolean Constraint Propagation (BCP), known as two literal watching, and a low overhead decision making strategy, known as Variable State Independent Decaying Sum (VSIDS). While substantial advances in solver run time result from the use of either two literal watching or VSIDS alone, synergistic effects result when the two are implemented together. The orders of magnitude increase in solver run time occur because the decision strategy of the present invention (VSIDS) is optimized for speed (not decision count), is specifically directed to recently added conflict clauses and is particularly designed to efficiently operate with the two literal watching BCP scheme of the present invention.

The method and system of the present invention applies to any representation of a Boolean function (formula), such as conjunctive normal form (CNF) representations or logic circuit representations. In addition to hardware, the methods can be implemented in software, where embodiments of the invention include a computer readable medium that configures a computer system to perform a method for determining satisfying variable assignments of a Boolean formula, or for determining that no satisfying variable assignments exist, and a computer-readable medium that stores a program for determining satisfying variable assignments of a Boolean formula, or for determining that no satisfying variable assignments exist.

In one aspect of the present invention, a satisfying variable assignment is determined by assigning a variable to zero or one. Implications are then generated using Boolean Constraint Propagation and by watching two literals, the two literals watched being randomly selected from variables not assigned to zero. Assignments and implications continue until a conflict is reached or until all variables are assigned. If a conflict is reached, the assignment of at least one variable is changed, implications resulting from the changed assignment are generated and further assignments and implications continue until determining a satisfying variable assignment, or until determining that no satisfying variable assignment exists.

In one aspect of the present invention, all variables being assigned and no conflict being reached indicates that a satisfying variable assignment has been determined. Also, a conflict being reached and no variable assignment to be changed remains indicates that no satisfying variable assignment exists for the boolean formula.

In another aspect of the present invention, when one of the two watched literals is assigned to zero, a variable not assigned to zero is randomly selected as a replacement, becoming one of the two literals watched. The present invention can accommodate any desired ordering for the selection of literals to watch. When all of the literals in a clause except one of the watched literals are assigned to zero, the remaining literal is then implied to one.

In another aspect of the present invention, a strategy termed Variable State Independent Decaying Sum (VSIDS) is used to select a variable for assignment. VSIDS is a method that counts each occurrence of a literal in each clause, creating a VSIDS ranking. A literal with the highest ranking is the literal appearing most often in the formula, and is characterized as the literal most likely to be set. The literal with the highest VSIDS rank is the literal selected for assignment.

As additional clauses (conflict clauses) are added during the running of the solver, the counter associated with each literal is incremented. Periodically, the counters are divided by a constant (which acts as a low pass filter) to favor, in the VSIDS ranking, literals included in recently created conflict clauses.

In another aspect of the present invention, instead of randomly selecting the literals to watch, VSIDS is used to select the watched literals. Here, the variable selected to watch is the variable determined least likely to be set among the variables not assigned to zero. The variable least likely to be set is the variable with the lowest VSIDS rank.

In another aspect of the present invention, VSIDS is used to select the two watched literals at solver start up. After the solver begins running, and replacement literals to be watched must be selected, the variable determined least likely to be set and not assigned to zero is still the variable selected for assignment, but determining the variable least likely to be set now considers a combination of a last decision level of a variable and the VSIDS rank of the variable. Using a combination of a last decision level of a variable and its VSIDS rank brings into the "likelihood to be set" evaluation a consideration that a variable might be set early due to an implication.

BRIEF DESCRIPTION OF THE DRAWINGS

For the purpose of illustrating the invention, there is shown in the drawing(s) a form that is presently preferred; it being understood, however, that this invention is not limited to the precise arrangements and instrumentalities shown.

DETAILED DESCRIPTION OF THE INVENTION

The Boolean Satisfiability (SAT) problem seeks to find a satisfying logical assignment to a propositional logic formula. SAT involves determining a satisfying variable assignment, $V$, for a Boolean function, $f$, or determining that no such $V$ exists. The variables can have (i.e., can be assigned) only two possible values (true or false, also referred to as one or zero, respectively), with the formula specifying valid combinations of the variables. SAT attempts to find assignments to the variables so that the formula evaluates to true, or to determine that no such assignment is possible. The present invention (Chaff) employs Davis-Putnam (DP) backtrack search strategy, which is common for complete solvers (i.e., solvers likely to find a satisfying assignment if one exists, or to prove unsatisfiability).

DP solvers, including Chaff, can operate on problems where $f$ is specified in conjunctive normal form (CNF). CNF consists of the logical AND of one or more clauses. Each clause consists of the logical OR of one or more literals. The literal is the fundamental logic unit of the SAT problem, defined as a variable (indicated herein as v, where v is the variable name) or its complement (indicated herein as –v). All Boolean functions can be described in CNF. The advantage of CNF is that in this form, for $f$ to be satisfied (i.e., sat), each individual clause must be sat (i.e., each clause must evaluate true).

While the method and system of the present invention will be primarily described herein in connection with CNF representations of Boolean functions, all aspects of the present invention apply equally well to other representational forms of Boolean functions, such as logic circuit representations. Naturally, a Boolean function represented in a form other than CNF, can be converted to CNF using well-known techniques, and satisfiability of the Boolean function can be checked using a SAT solver operable with CNF representations.

In a logic circuit representation of a Boolean function, basic logic operations (e.g., NOT, AND, OR) are represented using gates, which are physical entities for computing the logic operations. Inputs of the gates are the variables input to the function, as well as outputs of other logic functions. The function of interest (i.e., the function to which satisfiability is being determined) is the output of some logic gate in the circuit.

Basic Davis-Putnam (DP) Backtrack Search

To understand the operation of the present invention, a review of the basic Davis-Putnam backtrack search is provided, beginning with the following pseudo-code fragment:

```
while (true) {
    if (!decide()) // if no unassigned vars
        return(satisifiable);
    while (!bcp()) {
```

```
            if (!resolveConflict ())
        return(not satisfiable);
            }
    }
    bool resolveConflict() {
            d = most recent decision not 'tried both ways';
            if (d == NULL) // no such d was found
                return false;
            flip the value of d;
            mark d as tried both ways;
            undo any invalidated implications;
            return true;
    }
```

The operation of decide ( ) is to select a variable not currently assigned and to assign the variable a value, either true (one) or false (zero). The variable assignment is referred to as a decision. As each decision is made, a record of the decision is pushed onto a decision stack. This operation will return false if no unassigned variables remain and true otherwise.

The operation of bcp ( ) is to carry out Boolean Constraint Propagation (BCP). Based upon the variables assigned, and the state of the respective assignment (true or false), BCP identifies unassigned variables that, if assigned, would satisfy $f$.

In CNF, every clause must be sat for $f$ to be sat. So, if a clause consists of only literals with value zero and one (1) unassigned literal, then that unassigned literal must take on a value of one to make $f$ sat. Clauses in this state are said to be implied, or unit, the above referred to as the unit clause rule. The required assignment associated with making the last, unassigned literal true is referred to as an implication.

In a logic circuit representation for a Boolean function, the following implication rules are well-known:
1. If the input to a NOT gate is a zero, the output is implied to one.
2. If the output of a NOT gate is one, the input is implied to zero.
3. If the input to a NOT gate is a one, the output is implied to zero.
4. If the output of a NOT gate is zero, the input is implied to one.
5. If an input to an AND gate is a zero, the output is implied to zero.
6. If all inputs to an AND gate are a one, the output is implied to one.
7. If the output of an AND gate is zero, at least one of the inputs must be zero.
8. If the output of an AND gate is one, each input is implied to one.
9. If the input to an OR gate is a one, the output is implied to one.
10. If all inputs to an OR gate are a zero, the output is implied to zero.
11. If the output of an OR gate is one, at least one of the inputs must be one.
12. If the output of an OR gate is zero, each input is implied to zero.

Note that while the above implication rules are defined for the simple gates NOT, AND, OR, it is well-known to extend these to other simple gates (e.g., NOR, NAND) and also to complex gates where implications exist. In the context of a logic circuit representation, BCP refers to the repeated applications of the implication rules until there are no further implications. Thus, a DP solver can use BCP with either the CNF representation for Boolean functions, or the logic circuit representation.

In general, BCP identifies implied clauses and generates implications, thereby yielding more implied clauses generating more implications. In the above pseudo-code fragment, bcp ( ) carries out BCP transitively until either there are no more implications (in which case it returns true) or there is a conflict (in which case it returns false). A conflict occurs when implications for setting the same variable to both one and zero are produced.

If BCP terminates with no conflicts, there are two possibilities: no unassigned variables remain and $f$ is sat, or there are remaining unassigned variables and a decision needs to be made. Decisions consist of new variable assignments not driven by BCP. After a decision is made, BCP proceeds again. If BCP terminates with a conflict, a conflict resolution procedure is implemented, as explained below.

When a decision is made, a variable state exists and is represented by the decision stack. Any implication generated as a result of a new decision is directly triggered by that decision, but predicated on the entire prior variable state. By associating each implication with the triggering decision, a dependency can be compactly recorded in the form of an integer tag, referred to as a decision level (DL). For the basic DP search, the DL is equivalent to the height of the decision stack at the time the implication is generated.

The operation of resolveConflict ( ) seeks to undo variable assignments responsible for generating implications calling for the same variable to be set to both one and zero. All implications generated on the most recent decision level can be invalidated simply by flipping the value of the most recent decision assignment. Therefore, to resolve a conflict, all implications generated by the most recent decision assignment are undone, the value of the decision assignment is flipped, and BCP proceeds as normal. If both values of a decision assignment have been tried, the operation backtracks through the decision stack until encountering a decision that has not been tried both ways, and BCP proceeds from there as described above. In backtracking through the decision stack, all implications with decision levels equal to or greater than the decision level where backtracking ceases are invalidated. If, while attempting to resolve a conflict, no decision can be found that has not been tried both ways, $f$ is found not satisfiable. So, in general, conflict resolution involves backtracking a certain number of decisions (undoing all implications predicated upon that certain number of decisions), changing the state of the decision and proceeding with more BCP and decisions.

The above describes the overall structure of the basic DP search algorithm. Additional information can be found in the following publications, which are incorporated herein by reference for their useful background information:

M. Davis and H. Putnam, A Computing Procedure for Quantification Theory, *Journal of the ACM*, 7: 201-215, 1960.

M. Davis, G. Logemann and D. Loveland, "A Machine Program for Theorem-Proving", *Communications of ACM*, Vol. 5, No. 7, pp. 394-397, 1962.

Below are features specific to the present invention.

Optimizing BCP Using the Two-Literal Watching Scheme of Chaff

Since a significant majority of solver run time involves BCP, an efficient BCP engine is required for successful solver performance. As discussed, a clause is implied if all but one of its literals are assigned to zero. Accordingly, a quick analysis of all clauses becoming newly implied by a single addition (i.e., one more assignment) to a set of assignments would lead to efficient BCP implementation.

During BCP operation, basic intuition suggests looking at every clause that includes a literal set to zero by the most recent variable assignment. In effect, a counter for each clause would register how many value zero literals are in the clause, the counter registering each additional instance of a literal being set to zero. However, if a clause has N literals, there is no reason to visit the clause when 1, 2, 3, 4, ..., N−2 literals are set to zero. Efficiency dictates visiting the clause only when the "number of zero literals" counter goes from N−2 to N−1. So, theoretically, efficiency dictates ignoring the first N−2 assignments to zero for each clause.

To approximate this theoretical goal, the present invention selects for each clause any two literals not assigned to zero to watch at any given time. Thus, until one of the two literals watched is assigned to zero, there cannot be more than N−2 literals in the clause assigned to zero, meaning the clause is not implied. Accordingly, each clause need only be visited (evaluated) when one of its two watched literals is assigned to zero. BCP in the present invention ignores all assignments to the other literals in the clause. Therefore, when visiting any given clause (i.e., when one of the two watched literals is assigned to zero), one of two conditions must hold:

(1) The clause is not implied, and thus at least 2 literals are not assigned to zero, including the other currently watched literal. This means at least one non-watched literal is not assigned to zero. Accordingly, this literal (i.e., a non-watched literal not assigned to zero) is selected to replace the watched literal just assigned to zero. Therefore, a property (invariant) of the present invention, that the two watched literals are not assigned to zero, is maintained; or (2) The clause is implied. The procedure for visiting an implied clause is then followed (usually, this generates a new implication unless the clause is sat, for instance, when the other watched literal is all ready set to one). Note: the implied variable must always be the other watched literal (i.e., the watched literal not just assigned to zero), since, by definition, an implied clause has only one literal not assigned to zero.

BCP of the present invention identifies implied clauses and the associated implications while maintaining certain invariants, namely that each clause has two watched literals and that if a clause can become newly implied via any sequence of assignments, then the sequence will include an assignment of one of the watched literals to zero.

The two literal watching scheme of Chaff is advantageous because, at the time of backtracking, there is no need to modify (i.e., change the selection of) the watched literals in each clause. Accordingly, unassigning a variable can be done in constant time. Further, reassigning a variable recently assigned and unassigned is faster than the first time it was assigned. This is true because the variable is likely to be watched in a small subset of the clauses in which it was previously watched. This significantly reduces the total number of memory accesses, which, exacerbated by the high data cache miss rate, is the main bottleneck for most SAT implementations.

Figure 1:
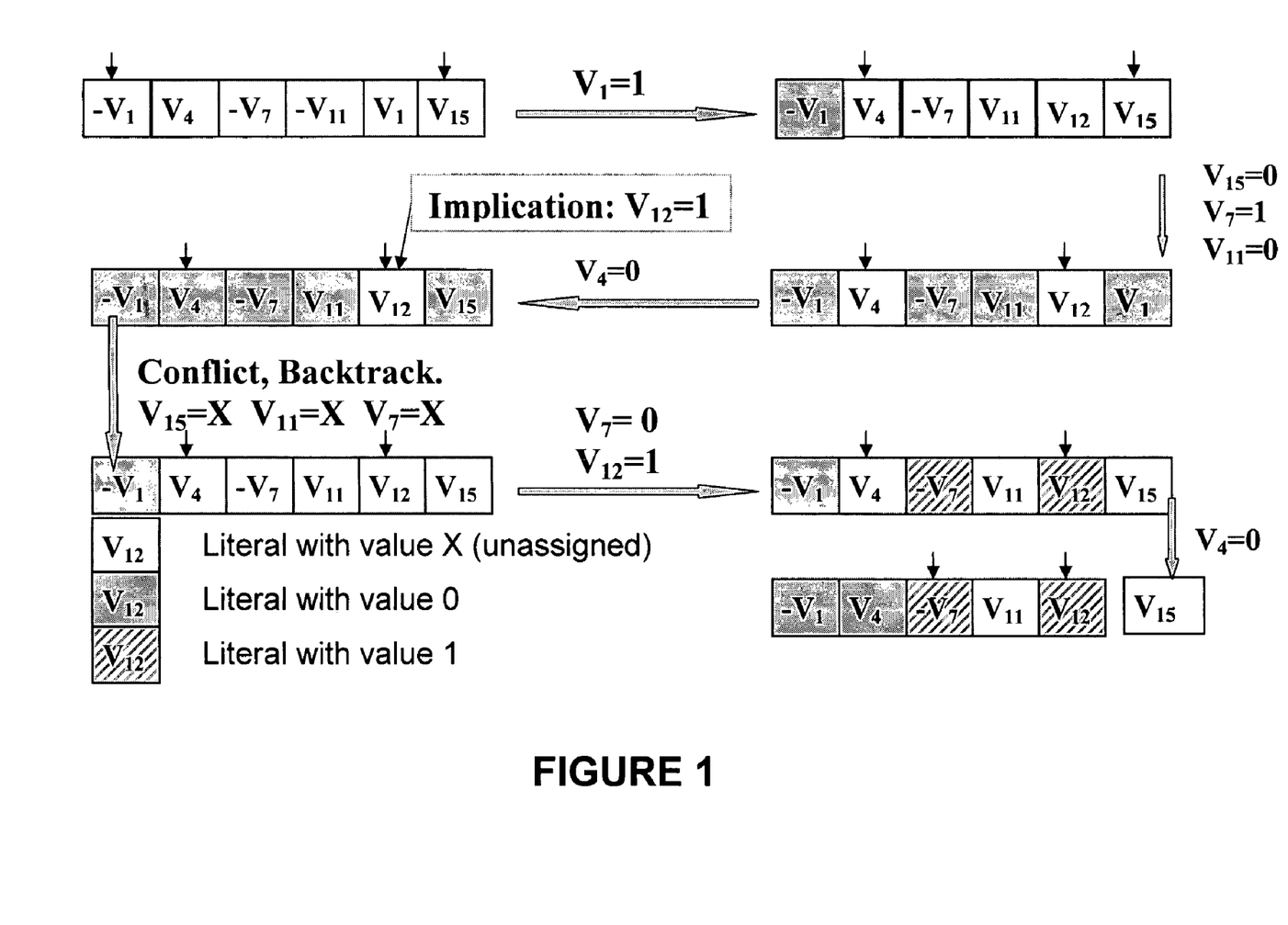
FIG. 1 illustrates Boolean Constraint Propagation using two literal watching, in accordance with the present invention.

FIG. 1 illustrates the two literal watching scheme of Chaff. FIG. 1 demonstrates how the selection of watched literals for a single clause changes under a series of assignments and unassignments.

For example, in FIG. 1, when a watched literal is assigned to zero (particularly −V1 and V15), a literal not assigned to zero is randomly selected as a replacement (V4 and V12).

When all but one literals are assigned to zero, the clause is implied, generating the implication that V12 be assigned to one. A conflict results, due to the other assignments previously made (and not shown in FIG. 1). Conflict resolution backtracks four assignments (leaving only the decision −V=0), undoing the implication and leaving unchanged the two literals being watched (V4 and V12). Note that the two watched literals also remain unchanged for the assignments V7=0 and V12=1, as these assignments do not set a watched literal to zero. With the assignment V4=0 (the assignment of a watched literal to zero), Chaff locates an unwatched literal not assigned to zero as a replacement literal to watch (in this instance, −V7).

Note that in FIG. 1, the initial selection of literals to watch is arbitrary (random), and that for purposes of the FIG. 1 illustration details regarding how the sequence of assignments and unassignments is generated is irrelevant. The replacement selection of literals to watch is also random, in the FIG. 1 embodiment, notwithstanding the invariant that a watched literal must not be assigned to zero if the clause can be implied in the future. It is to be understood, however, that the initial and replacement selection of literals to watch could be based on a pre-determined ordering, rather than by arbitrary selection. A method for pre-determining an order for watched literal selection is disclosed infra.

Comparing the Two-Literal Watching Schemes of Chaff and SATO

Although some similarities exist between the two-literal watching BCP scheme of the present invention and SATO (an existing SAT solver), there are distinct differences, the differences being responsible for the significant advantages of the BCP scheme of Chaff over SATO. Both schemes have the following common features:

For each literal, neither Chaff nor SATO access all of the clauses containing the literal. As discussed, an assignment to a literal does not require an evaluation of all clauses containing the literal. Accessing every clause containing a newly assigned literal is a slow operation, hampering solver run time.

For each clause, both Chaff and SATO "watch" a pair of literals and identify implied clauses and the associated implications.

Other than the above similarities, the two-literal watching BCP schemes of the present invention and SATO are significantly different, with the two-literal watching BCP scheme of Chaff having considerably superior run time performances. The differences between Chaff and SATO are outlined, below, in relation to specific aspects of the BCP algorithm.

Initialization:

Chaff: can randomly or specifically select the two literals to watch. There could be overall run-time advantages to selecting the watched literals in a certain order (as disclosed infra). The two-literal watching scheme of Chaff does not require a specific ordering of watched literals. So, Chaff accommodates various methods for selecting which literals to watch.

Figure 2:
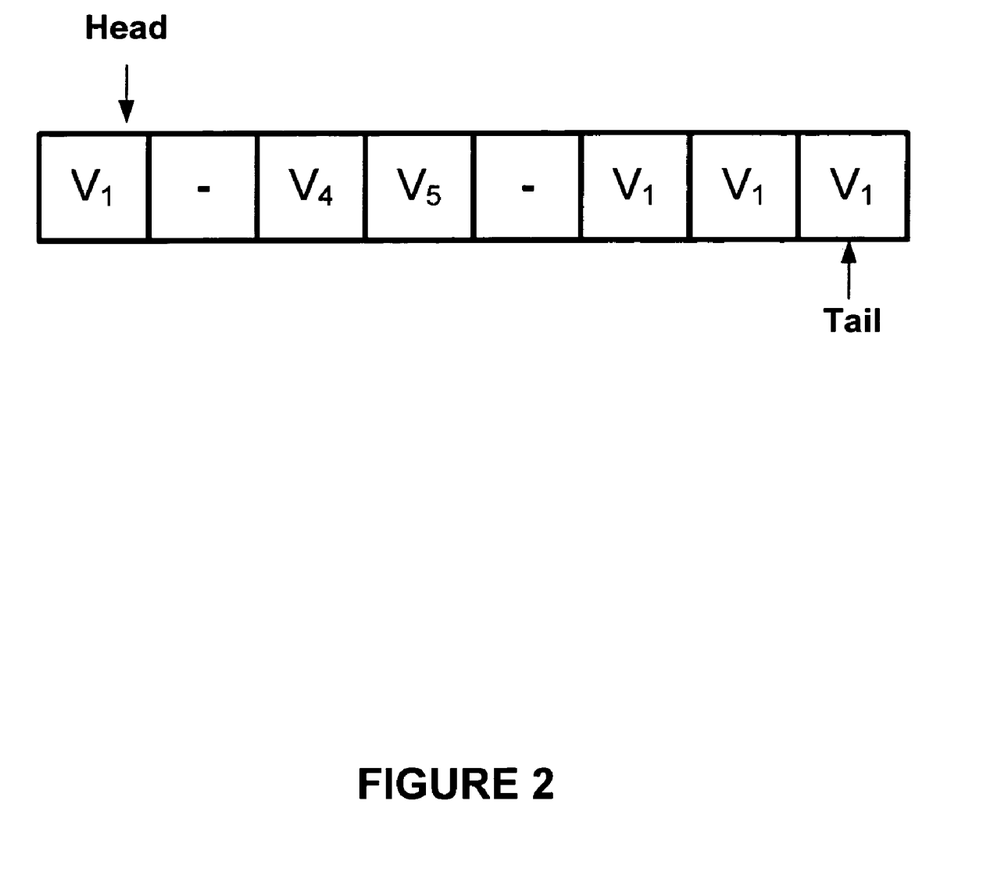
FIG. 2 illustrates Boolean Constraint Propagation using two literal watching of SATO, an existing SAT solver.

SATO: requires a specific ordering of watched literals. SATO must begin with the Head Pointer on the first literal in a clause and the Tail Pointer on the last literal in the clause. FIG. 2 illustrates the required ordering of the two watched literals in SATO. FIG. 2 depicts a single clause, with each box representing one literal in the clause.

Assignment of a watched literal to zero:

Chaff: when a watched literal is assigned to zero, the present invention attempts to find another literal in the clause that has not been assigned to zero. There are no other restrictions on the selection of a replacement literal to watch, just that the literal is currently not assigned to zero. Again, there may be advantages to a certain ordering when selecting replacement literals to watch, but a specific order is not required by the present invention.

SATO: requires a specific ordering when replacing watched literals. Referring to FIG. 2, if the first (head pointer) literal is assigned to zero, the head pointer moves to the right until locating an unassigned literal. If the last (tail pointer) literal is assigned zero, the tail pointer moves to the left until locating an unassigned literal.

Invariants:

Chaff: if a clause can ever result in an implication, then both of the currently watched literals must be unassigned.

SATO: if a clause can ever result in an implication, then all the literals to the left of the head pointer must be assigned to zero and all the literals to the right of the tail pointer must be assigned to zero.

Implication:

Chaff: an implication results when a watched literal is assigned to zero, and an attempt to find an unassigned literal to watch fails as all other literals are assigned to zero. In this instance, the remaining watched literal is implied to one.

SATO: an implication occurs when the head and the tail pointers of FIG. 2 each point to the same literal. This literal is implied to one.

Backtracking during conflict resolution:

Chaff: when backtracking one or more of the most recent decisions during conflict resolution, Chaff maintains its invariant by doing nothing (i.e., no change is made to the selection of watched literals). This characteristic provides run time efficiencies, as backtracking in Chaff does not involve accessing clauses to change the selection of literals watched.

SATO: understanding that backtracking may unassign one or more of the literals in the clause, SATO must re-establish the head and tail pointers to positions consistent with its invariant (i.e., a position where the literals to the left of the head pointer, and the literals to the right of the tail pointer, are assigned to zero). Re-establishing the pointers to positions consistent with its invariant involves repositioning the head pointer to the beginning of the clause and incrementally moving the head pointer to the right until locating the first unassigned literal, and repositioning the tail pointer to the end of the clause and incrementally moving the tail pointer to the left until the locating the first unassigned literal. Re-establishing the pointers during backtracking in SATO can be a very expensive (i.e., time consuming) operation, thereby significantly distinguishing Chaff from SATO and providing significant efficiencies during Chaff operation.

While the two literal watching scheme of the present invention has been described above for the CNF representation of Boolean functions, the two literal watching scheme of Chaff is also applicable to the logic circuit representation. Specifically, the following logic circuit implication rules (numbered below as numbered in the previous list of logic circuit implication rules) benefit from the two literal watching scheme of the present invention.

6. If all inputs to an AND gate are a one, the output is implied to one.

7. If the output to an AND gate is zero, at least one of the inputs must be zero.

10. If all inputs to an OR gate are a zero, the output is implied to zero.

11. If the output to an OR gate is one, at least one of the inputs must be one.

Two literal watching is applied to the inputs and outputs of AND, OR gates. For the case of an AND gate with k inputs (x1, x2, . . . , xk) and output z, any two of the literals (−x1, −x2, . . . −xk) and z are watched. This scheme detects the instance when all but one is assigned false, requiring that the remaining literal be implied to true (corresponding to rules 6 and 7 above). Similarly, for the case of an OR gate with k inputs (x1, x2, . . . , xk) and output z, any two of the literals (x1, x2, . . . xk) and −z are watched. This scheme detects the instance when all but one is assigned false, requiring that the remaining literal be implied to true (corresponding to rule 10 and 11 above).

For purposes of the present invention, the set of literals considered to generate the implication via two literal watching is referred to as a "clause". With a CNF representation, the literals considered are indeed a "clause". With a logic circuit representation, the literals considered constitute the input and output literals of a gate, as described above. The term "clause" is used equivalently in these instances (i.e., whether a CNF or a logic circuit representation) to provide a uniform mechanism of understanding for the CNF and the logic circuit representation of Boolean functions.

The Variable State Independent Decaying Sum (VSIDS) Decision Heuristic of Chaff

A decision assignment involves determining which unassigned variable to select for an assignment, and what state to assign for the selected variable, each time decide ( ) is called.

The simplest strategy selects the next decision randomly from the unassigned variables, an approach commonly denoted as RAND. At the other extreme, a heuristic is employed that involves the maximization of a moderately complex function of the current variable state and the clause database (e.g. BOHM and MOMs heuristics). One of the most popular strategies, falling somewhere in the middle of the spectrum, is the Dynamic Largest Individual Sum (DLIS) heuristic. DLIS selects the literal that appears most frequently in unresolved clauses.

Variations of the DLIS strategy have been developed, namely RDLIS and DLCS, as well as slightly more sophisticated heuristics such as JW-OS and JE-TS. For a description of the above methods and a review of the effect of decisions strategies on SAT solver performance, see the following publication, which is incorporated herein by reference for its valuable background information:

Marques-Silva, J. P., The Impact of Branching Heuristics in Propositional Satisfiability Algorithms, *Proceedings of the 9th Portuguese Conference on Artificial Intelligence (EPIA)*, September 1999.

There are a number of ways to evaluate the many strategies available. One could consider the number of decisions performed by the solver when processing a given problem. This evaluation method looks for a minimum of decisions, as fewer decisions ought to mean that smarter decisions were made. However, not all decisions yield an equal number of BCP operations, and as a result, a shorter sequence of decisions may actually lead to more BCP operations, and more conflicts, than a longer sequence of decisions. Furthermore, one must recognize that not all decision strategies have the same computational overhead, and as a result, the so-called "best" decision strategy (i.e., the strategy resulting in the minimum number of decisions) may actually be the slowest if overhead is significant. Accordingly, the most important question is: which strategy is fastest?

Chaff includes a strategy considerably faster than those existing in the art. This strategy, termed *Variable State Independent Decaying Sum* (VSIDS) is described as follows:

(1) Each variable in each polarity (i.e., each literal) has a counter, initialized to zero.
(2) When a clause is added to the database, the counter associated with each literal in the clause is incremented.
(3) The unassigned variable and polarity with the highest counter (highest VSIDS rank) is chosen at each decision.
(4) Ties are broken randomly by default, although this is configurable
(5) Periodically, all the counters are divided by a constant.

To choose the literal with the highest counter value quickly at decision time, a list of unassigned literals sorted by counter value is maintained during BCP and conflict analysis.

VSIDS attempts to satisfy all conflict clauses (by incrementing the counter associated with each literal for each new clause added to the database), but is particularly focused on satisfying recent conflict clauses (by dividing all counters by a constant). Since difficult problems generate many conflicts (and therefore many conflict clauses), it is the conflict clauses that dominate the problem in terms of literal count. VSIDS distinguishes itself, therefore, because of low pass filtering of the statistics (indicated above by step (5)), acting to favor the information generated by recent conflict clauses. VSIDS is valuable because it is the conflict clauses that primarily drive the search process on difficult problems. Also, VSIDS has very low overhead, since VSIDS rank is independent of variable state (except insofar as an unassigned variable must be selected), as statistics are mostly updated when there is a conflict, and correspondingly, a new conflict clause. Statistics are also updated periodically (but less frequently) when the counters are divided by a constant, as described in Step 5 above.

The VSIDS algorithm has been described above in terms of clauses in a CNF representation of a Boolean function. The VSIDS decision heuristic of the present invention can be equally well applied to a logic circuit representation of a circuit. The literal counts of a logic circuit representation of a circuit correspond to the occurrences of a literal at the input of a gate.

Synergistic Effects of Using VSIDS with the Two-Literal Watching BCP Scheme of Chaff While the VSIDS decision heuristic and the two-literal watching BCP scheme of Chaff are both individually useful, their combined use results in significant additional advantage. The additional advantage results from the static (i.e., does not depend on variable state) nature of the VSIDS decision heuristic, coupled with the characteristic of the two-literal watching BCP scheme dictating that a literal will no longer be watched if recently set to zero.

For example, assume the algorithm has made the following decisions: v2=T, v7=F, v9=T, v1=T (here T and F refer to true and false). It is understood, from the two-literal watching scheme of the present invention, that −v2, v7, −v9, and −v1 (all set to zero) are no longer watched in any clause. If a backtracking conflict resolution assigns v2 to F, it is very likely, given that VSIDS rankings change very slowly, that the next few decisions will still be v7=F, v9=T, v1=T. Since v7, −v9, and −v1 are no longer being watched in any clauses, the v7, v9 and v1 decisions result in no clause evaluation (i.e., no accesses to any clause), thus significantly speeding up BCP.

Note: this synergy inherently occurs because of the properties of VSIDS and the two-literal watching of Chaff.

Still further advantages can be gained, when the VSIDS decision heuristic and the two-literal watching BCP scheme of Chaff are used together, by selecting watched literals from a pre-determined ordering every time Chaff starts or uses restarts. Rather than randomly selecting the two literals to watch, the two literals least likely to be set are selected. Upon Chaff start-up, the two literals least likely to be set can be determined by an initial computation of VSIDS rank (i.e., the lower the VSIDS rank, the fewer times the variable appears, therefore, the less likely the variable is to be set). Chaff, like other SAT solvers (e.g. GRASP), employs a technique called restart. Periodically, Chaff will undo all its decisions and restart the solution process. The restart technique enables the exiting a solution space not likely to yield a solution and the search of other spaces. When Chaff restarts, the VSIDS rank could again be used to determine which variables are least likely to be set, or some formulaic (weighted) combination of the last decision level of a variable and its VSIDS rank could be used to determine the likelihood of the variable being set. Using a combination of the last decision level of a variable and its VSIDS rank is advantageous because even if a variable has a low VSIDS rank, the variable may be set early due to an implication and the last decision level data provides information directed to implications.

Accordingly, at each start or restart of Chaff, the literals in a clause are sorted in order of their likelihood to be set. The literal selected in the clause for assignment is the literal most likely to be set (the literal with the highest count, having the highest VSIDS rank). The literals selected to watch are the literals least likely to be set (literals with low count, having a low VSIDS rank). This strategy decreases the likelihood that the clause will be accessed as variables are set (i.e., assigned) during the running of the algorithm because the clause will only be accessed when a watched literal is assigned to zero.

Conflict Analysis, Learning, and Resolution

Recall that a conflict occurs when implications for setting the same variable to both one and zero are produced. The purpose of conflict analysis is to learn from the conflict that has just occurred and ensure that the conflict does not occur again. This is accomplished by adding one or more clauses, derived as a result of conflict analysis, to the formula being tested for satisfiability. This process is referred to as conflict driven learning, and the clauses as conflict clauses. Conflict clauses are derived, in modern SAT solvers such as GRASP and Chaff, using implication graph data structure.

Figure 3:
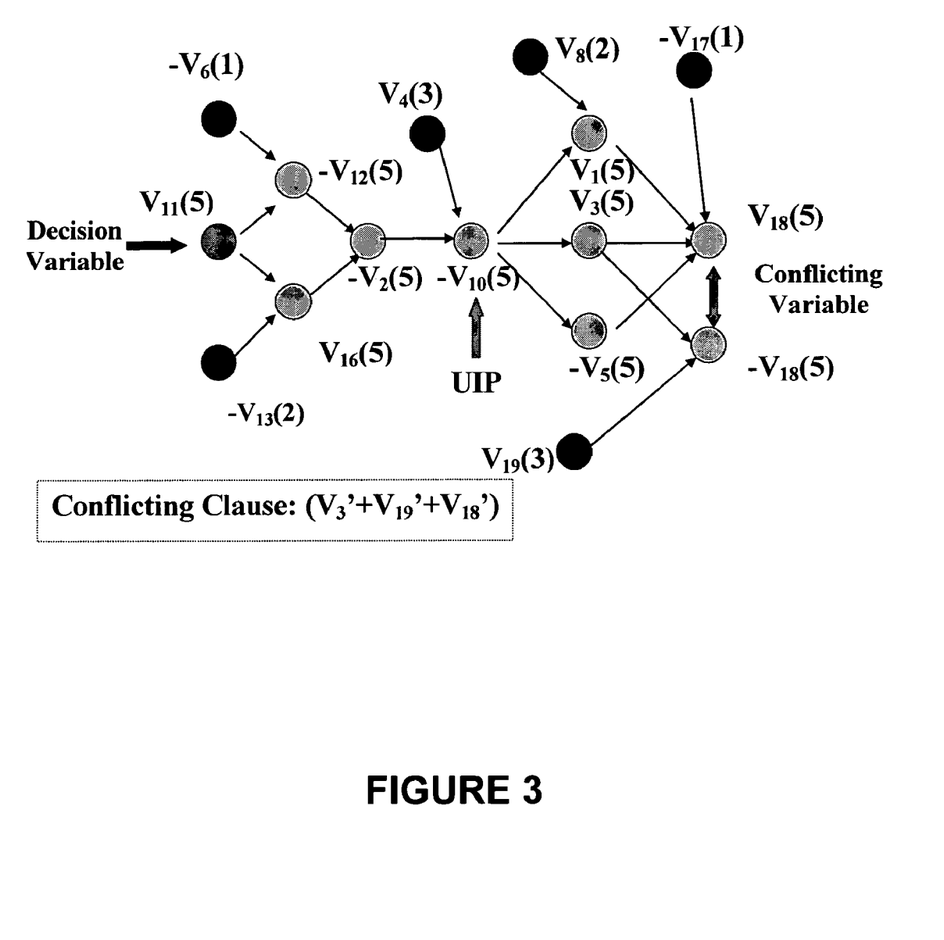
FIG. 3 illustrates an implication graph showing implication relationships of variable assignments to demonstrate conflict occurrence during the SAT solving process, in association with conflict analysis and resolution techniques of the present invention.

Implication relationships of variable assignments occurring during the SAT solving process can be expressed in an implication graph. FIG. 3 illustrates a typical implication graph. The implication graph is a directed acyclic graph (DAG). Each vertex represents a variable assignment. A positive variable refers to an assignment of 1; a negative variable refers to an assignment of 0. The incident edges of each vertex illustrate the reason(s) leading to the respective assignment (i.e., the assignment(s) that caused the implication). Vertices having directed edges to a certain vertex are referred to as antecedent vertices. A decision vertex has no incident edge. Each variable has a decision level, denoted in the graph as the number within parenthesis. In an implication graph with no conflict, there is at most one vertex for each variable. A conflict occurs when a vertex exists for both the 0 and the 1 assignment of a variable. Such a variable is referred to as a conflicting variable. In FIG. 3, the variable $V_{18}$ is the conflicting variable.

The original DP backtrack search proposed the simplest conflict analysis method. For each decision variable, the solver retains a flag indicating whether or not the variable was tried in both phases. When a conflict occurs, the conflict analysis methodology looks for the decision variable with the highest decision level that has not been flipped, marks it flipped, undoes all the assignments between that decision level and the current decision level, and then assigns the other phase for the decision variable.

More advanced conflict analysis methods rely on the implication graph to determine the cause for the conflict, and perform conflict directed backjumping to back up more than one level of the decision stack. Thus, conflict directed backjumping is also known as non-chronological backtracking. Additional information on non-chronological backtracking can be found in the following publications, which are incorporated herein by reference for their useful background information:

R. Bayardo, and R. Schrag, "Using CSP look-back techniques to solve real-world SAT instances," In, *Proceedings of the 14th Nat. (US) Conf. on Artificial Intelligence (AAAI-97)*, AAAI Press/The MIT Press, 1997.

Marques-Silva, J. P., and Sakallah, K. A., "GRASP: A Search Algorithm for Propositional Satisfiability," *IEEE Transactions on Computers*, vol. 48, 506-521, 1999.

Concurrently therewith, the conflict analysis methods add clauses to the database. This process is called learning, and the learned clauses are called conflict clauses, as opposed to conflicting clauses, which refer to clauses that cause the conflict. Conflict clauses record the reasons for the conflict, as deduced from the conflict, to avoid the occurrence of the same mistake again. Conflict clauses state that certain combinations of variable assignments are not valid, as they force the conflicting variable to assume both the value 0 and 1, thus leading to a conflict.

Figure 4:
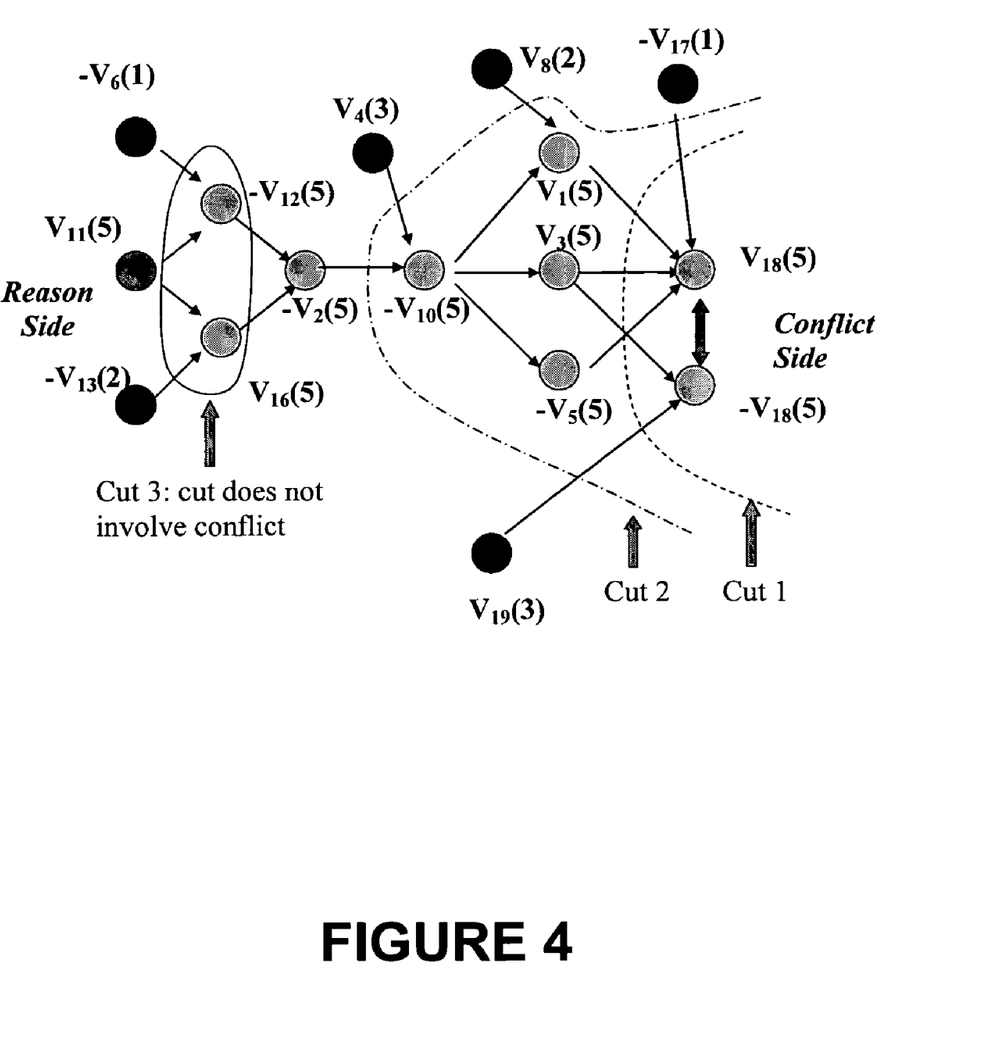
FIG. 4 illustrates use of the implication graph of FIG. 3 in the conflict analysis and learning process of the present invention to generate conflict clauses used in conflict resolution.

A conflict clause is generated by a bipartition (i.e., partition into two parts) of the implication graph. The partition has all decision variables on one side (called reason side), and the conflicting variable on the other side (called conflict side). All vertices on the reason side, having at least one edge to the conflict side, comprise the reason for the conflict. Such a bipartition is referred to as a cut. Different cuts correspond to different learning schemes. For example, in FIG. 4, clause $(V_1'+V_3'+V_5+V_{17}+V_{19}')$ corresponds to Cut 1, and can be added as a conflict clause. Similarly, Cut 2 corresponds to clause $(V_2+V_4'+V_8'+V_{17}+V_{19}')$ (Note: V' is alternate notation for –V). Different cuts can result in different conflict clauses being added. A study of the quality of different cuts is provided in the following publication, which is incorporated herein by reference for its useful background information:

L. Zhang, C. Madigan, M. Moskewicz and S. Malik, "Efficient Conflict Driven Learning in a Boolean Satisfiability Solver," In, *Proceedings of the International Conference on Computer-Aided Design* (ICCAD), 2001.

For the present invention, it is sufficient to state that one or more of the cuts is used to generate the conflict clauses.

Note that for the above conflict analysis, it does not matter whether the implications were generated using a CNF representation, or a logic circuit representation, of the Boolean function. In the above description, conflict analysis results in a clause being added to the CNF representation. In a DP solver based on a logic circuit representation, conflict analysis adds an OR gate (corresponding to the clause), whose output needs to be ANDed with the function for which satisfiability is being tested. Therefore, conflict-driven analysis applies equally well to both CNF and logic circuit representations of a Boolean function.

Clause Deletion

The present invention, like many solvers, supports the deletion of added conflict clauses to avoid a memory explosion. However, the method for doing so in Chaff differs from standard methods employed. Essentially, Chaff uses scheduled lazy clause deletion. When each clause is added, it is examined to determine at what point in the future, if any, the clause should be deleted. The metric used is relevance, such that when more than N (where N is typically 100-200) literals in the clause will become unassigned for the first time, the clause will be marked as deleted. The actual memory associated with deleted clauses is recovered with an infrequent monolithic database compaction step.

Restarts

The present invention also employs restarts. Restarts consist of halting the solution process and then restarting the analysis, with some of the information gained from the previous analysis included in the new, restarted analysis. As implemented in Chaff, a restart clears the state of all the variables (including all the decisions), and then proceeds as normal. As a result, any still-relevant clauses added to the clause database at some time prior to the restart are still present after the restart. For this reason, the solver will not repeat, after the restart, the analysis occurring prior to the restart. In addition, a certain amount of transient randomness can be added to the decision procedure to aid in the selection of a new search path. Such randomness is typically small, and lasts for only a few decisions. The frequency of restarts and the characteristics of the transient randomness are configurable in the final implementation. Also, restarts impact the completeness of the algorithm. If all clauses were kept, however, the algorithm would still be complete, so completeness could be maintained by increasing the relevance parameter N slowly with time. A study of restarts is provided in the following publication, which is incorporated herein by reference for its useful background information:

Luís Baptista, Inês Lynce and João P. Marques-Silva, Complete Search Restart Strategies for Satisfiability, in the IJCAI'01 Workshop on Stochastic Search Algorithms (IJCAI-SSA), August 2001.

The restarts of the present invention do not affect the current decision statistics. Restarts are mainly intended to provide an opportunity to change early decisions in view of the current problem state, including all added clauses and the current search path. With default settings, Chaff may restart thousands of times on a hard instance (sat or unsat), although similar results can often be achieved with restarts completely disabled.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention.

What is claimed is:

1. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;
b. assigning an unassigned variable in the Boolean formula to zero or one;
c. generating implications in the Boolean formula resulting from the assignment using Boolean Constraint Propagation, wherein implications are generated by watching two literals within a sub-formula corresponding to a clause or a gate in the Boolean formula, the two literals watched being randomly selected from literals not assigned to zero; and
d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

2. The method of claim 1, wherein initially both of the two watched literals are unassigned.

3. The method of claim 1, wherein, when one of the two watched literals is set to zero by a variable assignment or by an implication, the one watched literal set to zero is replaced as a watched literal by a randomly selected literal from the same clause or gate that is not set to zero and is not currently being watched, and where no randomly selected literal from the same clause or gate that is not set to zero and is not currently being watched is available, an implication is generated setting the other of the two watched literals to one.

4. The method of claim 1, wherein unassigning a variable results in no change to the two literals selected for watching.

5. The method of claim 1, wherein the Boolean formula is represented in conjunctive normal form.

6. The method of claim 1, wherein the Boolean formula is represented as a logic circuit.

7. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;
b. assigning an unassigned variable in the Boolean formula to zero or one;
c. generating implications in the Boolean formula resulting from the assignment using Boolean Constraint Propagation, wherein implications are generated by watching two literals within a sub-formula corresponding to a clause or a gate in the Boolean formula, the two literals watched being randomly selected from literals not assigned to zero; and
d. continuing steps (b) and (c) until reaching a conflict or until all variables are assigned, wherein upon reaching a conflict the assignment of at least one variable is changed, implications resulting from the changed assignment are generated and steps (b) and (c) continue until reaching a conflict or until all variables are assigned, whereby:

i. all variables being assigned and no conflict reached indicates that a satisfying variable assignment has been determined and that the software program or the hardware circuit is proved incorrect, with the satisfying variable assignment representing the incorrectness condition; and
  ii. a conflict is reached and no variable assignment to be changed remains indicates that no satisfying variable assignment exists for the Boolean formula and that the software program or the hardware circuit is proved correct.

8. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;
b. assigning an unassigned variable in the Boolean formula to zero or one;
c. generating implications in the Boolean formula resulting from the assignment using Boolean Constraint Propagation, wherein implications are generated by watching two literals within a sub-formula corresponding to a clause or a gate in the Boolean formula, the two literals watched being selected from literals not assigned to zero, wherein, upon a setting to zero of one of the two literals watched, by a variable assignment or by an implication, a literal from the same clause or gate that is not set to zero and is not currently being watched is randomly selected as a replacement, becoming one of the two literals watched, and where no randomly selected literal from the same clause or gate that is not set to zero and is not currently being watched is available, an implication is generated setting the other of the two watched literals to one; and
d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

9. The method of claim 8, wherein the Boolean formula is represented in conjunctive normal form.

10. The method of claim 8, wherein the Boolean formula is represented as a logic circuit.

11. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;
b. assigning an unassigned variable in the Boolean formula to zero or one, wherein a Variable State Independent Decaying Sum (VSIDS) is used to determine which unassigned variable to assign;

c. generating implications in the Boolean formula resulting from the assignment using Boolean Constraint Propagation; and d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

12. The method of claim 11, wherein the Boolean formula is represented in conjunctive normal form.

13. The method of claim 11, wherein the Boolean formula is represented as a logic circuit.

14. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing correctness of the software program or the hardware circuit;

b. assigning an unassigned variable in the Boolean formula to zero or one, wherein the variable selected for assignment is determined by a Variable State Independent Decaying Sum (VSIDS) rank;

c. generating implications in the Boolean formula resulting from the assignment using Boolean Constraint Propagation; and d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

15. The method of claim 14, wherein the higher the VSIDS rank the more likely the variaNe is to be set.

16. The method of claim 14, wherein the Boolean formula is represented in conjunctive normal form.

17. The method of claim 14, wherein the Boolean formula is represented as a logic circuit.

18. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;

b. assigning an unassigned variable in the Boolean formula to zero or one;

c. generating implications in the Boolean formula resulting from the assignment using Boolean Constraint Propagation, wherein implications are generated by watching two literals within a sub-formula corresponding to a clause or a gate in the Boolean formula, the two literals watched being selected from literals not assigned to zero and determined least likely to be set as determined by a Variable State Independent Decaying Sum (VSIDS) rank; and d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

19. The method of claim 18, wherein the lower the VSIDS rank the less likely the variable is to be set.

20. The method of claim 18, wherein determining which variables are least likely to be set considers a combination of a last decision level of a variable and a Variable State Independent Decaying Sum (VSIDS) rank of the variable.

21. The method of claim 18, wherein the Boolean formula is represented in conjunctive normal form.

22. The method of claim 18, wherein the Boolean formula is represented as a logic circuit.

23. A method implemented at least in part by a machine for determining satisfying variable assignments of a Boolean formula, or for determining that no satisfying variable assignments exist, to find an error in or prove the design correctness of a software program or a hardware circuit, the method comprising the steps of:

a. generating a Boolean formula representing error conditions of the software program or the hardware circuit;

b. assigning an unassigned variable in the Boolean formula to zero or one, wherein selecting which variable to assign is determined by:

i. counting each occurrence of a literal in each clause or gate of the Boolean formula;

ii. ranking each literal based upon total occurrences counted, a highest ranking being associated with the most total occurrences; and iii. selecting the variable with the highest ranking for assignment;

c. generating implications in the Boolean formula resulting from the assignment using Boolean Constraint Propagation, wherein implications are generated by watching two literals within a sub-formula corresponding to a clause or a gate in the Boolean formula, the two literals watched being initially selected from literals not assigned to zero, wherein, upon a setting to zero of one of the two literals watched by a variable assignment or by an implication, a literal from the same clause or gate that is not set to zero and is not currently being watched is selected as a replacement, becoming one of the two literals watched, and where no randomly selected literal from the same clause or gate that is not set to zero and is not currently being watched is available, an implication is generated setting the other of the two watched literals to one; and d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, with the satisfying variable assignment representing the incorrectness condition, or until determining that no satisfying variable assignment exists, whereby the software program or the hardware circuit is proved correct.

24. The method of claim 23, wherein the initial and replacement selections from literals not assigned to zero of the two literals watched is random.

25. The method of claim 23, wherein the initial and replacement selections from literals not assigned to zero of the two literals watched involves determining which variables are least likely to be set and selecting the literal not assigned to zero that is least likely to be set.

26. The method of claim 25, wherein determining which variable is least likely to be set for the initial and replacement selections of the two literals watched involves a computation of a VSIDS rank.

27. The method of claim 26, wherein the lower the VSIDS rank of a variable the less likely the variable is to be set.

28. The method of claim 25, wherein determining which variable is least likely to be set for the replacement selection of one of the two literals watched considers a combination of a last decision level of a variable and a VSIDS rank of the variable.

29. The method of claim 23, wherein the Boolean formula is represented in conjunctive normal form.

30. The method of claim 23, wherein the Boolean formula is represented as a logic circuit.

31. A method implemented at least in part by a machine for determining satisfying variable assignments of a Boolean formula, or for determining that no satisfying variable assignments exist, to prove the design correctness of a software program or a hardware circuit, the method comprising the steps of:

a. generating a Boolean formula representing correctness of the software program or the hardware circuit;

b. assigning an unassigned variable in the Boolean formula to zero or one;

c. generating implications in the Boolean formula resulting from the assignment using Boolean Constraint Propagation, wherein implications are generated by watching two literals within a sub-formula corresponding to a clause or a gate in the Boolean formula, the two literals watched being randomly selected from literals not assigned to zero and initially set to unassigned, wherein, when one of the two watched literals is set to zero by a variable assignment or by an implication, the one watched literal set to zero is replaced as a watched literal by a randomly selected literal from the same clause or gate that is not set to zero and is not currently being watched, and where no randomly selected literal from the same clause or gate that is not set to zero and is not currently being watched is available, an implication is generated setting the other of the two watched literals to one; and d. continuing steps (b) and (c) until reaching a conflict or until all variables are assigned, wherein upon reaching a conflict the assignment of at least one variable is changed, implications resulting from the changed assignment are generated and steps (b) and (c) continue until determining a satisfying variable assignment, whereby the software program or the hardware circuit is proved incorrect, or until determining that no satisfying variable assignment exists, whereby the software program or the hardware circuit is proved correct.

* * * * *